United States Patent [19]

Frankland

[11] Patent Number: 5,498,996
[45] Date of Patent: Mar. 12, 1996

[54] HIGH-POWER, HIGH-FIDELITY TUBE AMPLIFIER

[75] Inventor: Scott G. Frankland, San Jose, Calif.

[73] Assignee: Wavestream Kinetics, Los Angeles, Calif.

[21] Appl. No.: 342,832

[22] Filed: Nov. 21, 1994

[51] Int. Cl.$^6$ ..................................................... H03F 3/28
[52] U.S. Cl. ........................................ 330/118; 330/122
[58] Field of Search .............................. 330/55, 118, 119, 330/120, 121, 122, 124 R

[56] References Cited

U.S. PATENT DOCUMENTS

| | | | |
|---|---|---|---|
| 2,161,844 | 6/1939 | Bäbler | 179/171 |
| 2,273,997 | 2/1942 | Rubin | 179/171 |
| 2,516,181 | 7/1950 | Bruene | 179/171 |
| 2,631,200 | 3/1953 | Christaldi | 179/171 |
| 2,778,884 | 1/1957 | Amatniek | 179/171 |
| 2,860,192 | 11/1958 | McIntosh | 179/171 |
| 2,919,411 | 12/1959 | Fallier, Jr. | 330/119 |
| 2,921,266 | 1/1960 | Kiebert | 330/119 |
| 3,092,783 | 6/1963 | Krohn | 330/98 |
| 3,122,713 | 2/1964 | Parker | 330/122 |
| 3,566,236 | 2/1971 | Johnson | 330/192 |
| 3,573,648 | 4/1971 | Nestorovic | 330/82 |
| 3,909,658 | 9/1975 | Swanson | 315/39 |
| 4,066,975 | 1/1978 | Key et al. | 330/81 |
| 5,302,912 | 4/1994 | Grant | 330/118 |

OTHER PUBLICATIONS

Sutherland, R. I., *Care and Feeding of Power Grid Tubes*, Varian, San Carlos, CA, 1967, p. 34.
Marshall, J., "Extending Amplifier Bandwidth," *Rad.–Elec.*, Oct. 1953, pp. 40–41.
Bode, H. W., *Network Analysis and Feedback Amplifier Design*, van Nostrand, Princeton, NJ, 1945, pp. 106–109, 120–123.
Cherry, E. M., "Transient Intermodulation Distortion—Part 1: Hard Nonlinearity," *IEEE Trans. on Acous., Speech, and Sig. Proc.*, 29:2, Apr. 1981, pp. 137–146.
Sobel, A., "Constant Current Audio Power Amplifiers," *Elect.*, Mar. 1953, pp. 124–125.
Crowhurst, N., *Understanding Hi–Fi Circuits*, Gernsback, Library Inc., NY 1957, pp. 37–40.
Ravenswood, H., "The Fixed–bias Story," *Radio Elect.*, Feb. 1958, pp. 47–49.
Vander Kooi, M. K., "Predicting and Avoiding Slew Rate Limiting," *Elec. Eng.*, Feb. 1973, pp. 18–19.
M. J FAX 443, McIntosh MC3500 (MJ Audio History P10), Jul., 1985—Schematic.
Barton, L. E., "High Audio Power from Relatively Small Tubes," *Proc. IRE*, 19.7, Jul. 1931, pp. 1139–1140.
Ryder, J. D., *Engineering Electronics*, McGraw–Hill, Inc., NY 1957, pp. 5–7; 73–75; 171–178.
Olson, H. F., *Music Physics, and Engineering*, Dover Pubs., Inc., NY, 1967, 2nd ed., pp. 388–391.
Tremaine, H. M., *The Audio Cyclopedia*, Howard W. Sams & Co., Indianapolis, IN, 1969 (2nd ed.), reissued 1978, p. 610.

*Primary Examiner*—Steven Mottola
*Attorney, Agent, or Firm*—Poms, Smith, Lande & Rose

[57] ABSTRACT

A high-power, high-fidelity tube amplifier which includes a plurality of output tubes connected in parallel with individual current sinks and a plurality of parasitic suppression components. Each current sink is electrically coupled to its corresponding output tube such that the output impedance of the current sink decreases as the grid current of the corresponding output tube increases.

50 Claims, 4 Drawing Sheets

HIGH-POWER, HIGH-FIDELITY TUBE AMPLIFIER

BACKGROUND OF THE INVENTION

1. Field of the Invention

The present invention relates to a high-power, high-fidelity tube amplifier and, more particularly, pertains to a high-power, high-fidelity tube amplifier employing output tubes connected in parallel with each output tube having an individual current sink.

2. Description of the Related Art

In the art of amplifiers, the term "high-fidelity" evokes the dual goals of wide bandwidth and low distortion. A problem typically associated with high-fidelity amplifiers, particularly amplifiers employing tubes, is that bandwidth decreases and high frequency distortion increases as power output is increased. The usual method to increase power output in push-pull amplifiers is to parallel output devices, as by doubling, tripling, quadrupling, etc., the number of tubes; depending on the desired power output. Generally speaking, the power output-in amplifiers doubles every time the number of output devices is doubled.

FIG. 1 shows performance characteristics of a push-pull pair of KT88 beam tetrodes manufactured in Great Britain. Since the negative excursion in a push-pull amplifier is a mirror-image of the positive excursion, only the latter is discussed. The upper half of FIG. 1 is a plot of plate current along the vertical axis versus plate voltage along the horizontal axis at varying grid voltages. The load line is drawn to intersect the vertical and horizontal axes at the maximum plate current and voltage, respectively, and also defines an operating point Q at the center of the load line. It is perhaps not widely appreciated that when output devices are configured in parallel, distortion is reduced at any given power level. This is because the excursion about the operating point Q is reduced for any given power level.

As the input signal (the grid no. 1 voltage) applied to the push-pull amplifier increases, the plate current increases. Since the spacing between the conductance curves increases with departure from Q, it may be readily appreciated that non-linearities and thus distortion are also increased with departures from Q. More specifically, the variations in spacing determine the magnitude of the odd-order distortion products which remain in the output of a push-pull amplifier at any given power level.

Whether the technique of configuring output devices in parallel is used to increase power or reduce distortion, the penalty in each case is the same: the total capacitance seen by the driver stage is doubled for every doubling of the output devices. Such an increase in capacitance effects a low-pass filtering of the audio signal which can severely impair the high frequency response of the amplifier. When this occurs, the feedback signal will also be impaired. This is because the feedback signal amplitude is dependent upon the output signal amplitude. Thus, the feedback will be reduced at high frequencies, and the distortion will be increased at those frequencies, due to the roll-off. Thus, in the case of prior art systems, the goal of increasing amplifier power by simply increasing the number of output devices defeats the high-fidelity objective of increasing the power output while simultaneously maintaining low broadband distortion and wide frequency response.

Proposed solutions to the foregoing problem include the use of transmitting tubes in parallel. However, such an approach is not practical because the dangerously high voltages required to operate transmitting tubes precludes their use in the consumer market. Furthermore, transmitting tubes are undesirable because they must be operated in class-B to fully realize their power capability within the rating of their plate dissipation. In class-B operation, the tubes are biased approximately to cut-off and there is no negative voltage swing for either side of a push-pull amplifier. Generally, high-fidelity audio amplifiers are not operated in class-B due to unacceptable distortion levels and spurious transients.

A prior art tube amplifier, the McIntosh MC3500 manufactured by McIntosh of Binghamton, N.Y., used eight output tubes in class-$AB_2$ push-pull parallel, driven by a cathode-follower triode on each push-pull side (a typical configuration). Because the bias circuit is included in the cathode-follower current path, the McIntosh MC3500 included a signal bypass capacitor (50 µF, 150 V) in said bias circuit to insure that the signal level applied to each output tube would not vary with adjustments to the bias controls. A deficiency of the foregoing amplifier is that the bypass capacitor contributes a low-frequency pole, which then adversely affects amplifier performance characteristics by inducing phase changes in the feedback signal at low frequencies. Such phase changes, in turn, modify the feedback factor resulting in increased distortion and compromised stability and pulse response characteristics.

A more serious deficiency of the aforementioned amplifier is that the driver tube sees the input capacitance of four output tubes in parallel. Moreover, it must sink the grid current of all four output tubes.

In contrast, the class-$AB_2$ amplifier of the present invention drives each output tube from a separate, specially configured driver tube; called a "grid-current sink," or "current sink." Each current sink sees the capacitance of a single output tube only; thereby increasing bandwidth. Similarly, each current sink dissipates the grid current of a single output tube only; thereby reducing driver distortion while increasing power output.

In addition, adjustments to the bias circuits do not alter the signal level going into the output tubes. This eliminates the need for a bypass capacitor; thereby increasing the low-frequency stability margin and/or allowing more feedback to be applied.

The high-power, high-fidelity tube amplifier of the present invention includes at least two push-pull pairs of output tubes connected in parallel to provide an output signal, and a plurality of high transconductance driver tubes. Moreover, each of the driver tubes is direct coupled to a corresponding output tube and is biased such that the output impedance of the driver tube decreases as the grid current of its corresponding output tube increases.

The low output impedance of each current sink (which appears in series with the input grid of the output tube corresponding thereto) thus minimizes the deleterious low-pass filtering effect mentioned above. Since the current sinks are configured as cathode followers, the input capacitance of this stage will be negligible.

Thus, the amplifier of the present invention employs high transconductance current sinks which advantageously sink output tube grid current so that additional power is obtained from the output tubes without the introduction of undesired high-frequency distortion or roll-off. The amplifier is configured such that there is an individual current sink for each output tube, thereby permitting the output tubes to be indefinitely configured in parallel for virtually unlimited amplifier power output without compromising bandwidth or increasing the high frequency distortion.

Accordingly, an object of the present invention is to provide increased power output in high-fidelity audio amplifiers utilizing multiple output tubes.

Another object is to provide a high-power tube amplifier that achieves increased levels of power output without compromising bandwidth or increasing high frequency distortion.

Still another object is to provide a high-power, high-fidelity tube amplifier employing parallel output tubes with individual current sinks.

A further object is to provide a high-power, high-fidelity tube amplifier wherein the individual current sinks are directly coupled to the output tubes to sink output tube grid current so that additional power is obtained from the output tubes.

Yet another object is to provide a high-power, high-fidelity tube amplifier wherein the transconductance of the individual current sinks increases in response to increased output tube grid current, thereby reducing driver distortion at the higher power levels.

An additional object is to provide a high-power, high-fidelity amplifier with an increased gain bandwidth product and more uniform feedback.

Another object is to provide a high-power, high-fidelity tube amplifier without bypass capacitors, thereby increasing the amplifier's low-frequency stability margin.

Still another object is to provide a high-power, high-fidelity amplifier wherein there is reduced driver interaction with mismatched output tubes, thereby resulting in improved isolation and reduced driver distortion with multi-tube output stages.

A further object is to provide a high-power, high-fidelity amplifier wherein the perveance limit of the output tubes is increased.

A further object is to prevent biasing back the output tubes when grid current flows.

SUMMARY OF THE INVENTION

In accordance with a specific illustrative embodiment of the present invention, a high-power, high-fidelity tube amplifier includes a plurality of output tubes connected in parallel to provide an output signal, a plurality of high transconductance driver tubes electrically coupled to the output tubes, and a plurality of parasitic suppression components electrically coupled to the output tubes and the driver tubes. The cathode of each driver tube is electrically coupled to the control grid of a corresponding output tube such that the output impedance of the driver tube decreases as the grid current of the corresponding output tube increases.

In a further aspect of the present invention, each of the output tubes includes a cathode, a control grid, a screen grid and a plate, with the screen grid and the plate of each output tube being electrically coupled.

In another aspect of the present invention, each of the high transconductance driver tubes includes a cathode, a control grid, a screen grid, a suppressor grid and a plate, with the screen grid, the suppressor grid and the plate of each driver tube being electrically coupled together.

Still another aspect of the present invention includes the parasitic suppression components: including a first group, a second group and a third group of parasitic suppression components. The first group are electrically coupled to the control grids of the driver tubes, the second group are electrically coupled between the cathode of each driver tube and the control grid of the corresponding output tube, and the third group are electrically coupled to the screen grid of each output tube.

DESCRIPTION OF THE DRAWINGS

Other objects, features and advantages of the invention will become readily apparent upon reference to the following detailed description when considered in conjunction with the accompanying drawings, in which like reference numerals designate like parts throughout the figures thereof, and wherein.

DETAILED DESCRIPTION OF THE PREFERRED EMBODIMENTS

Figure 4:
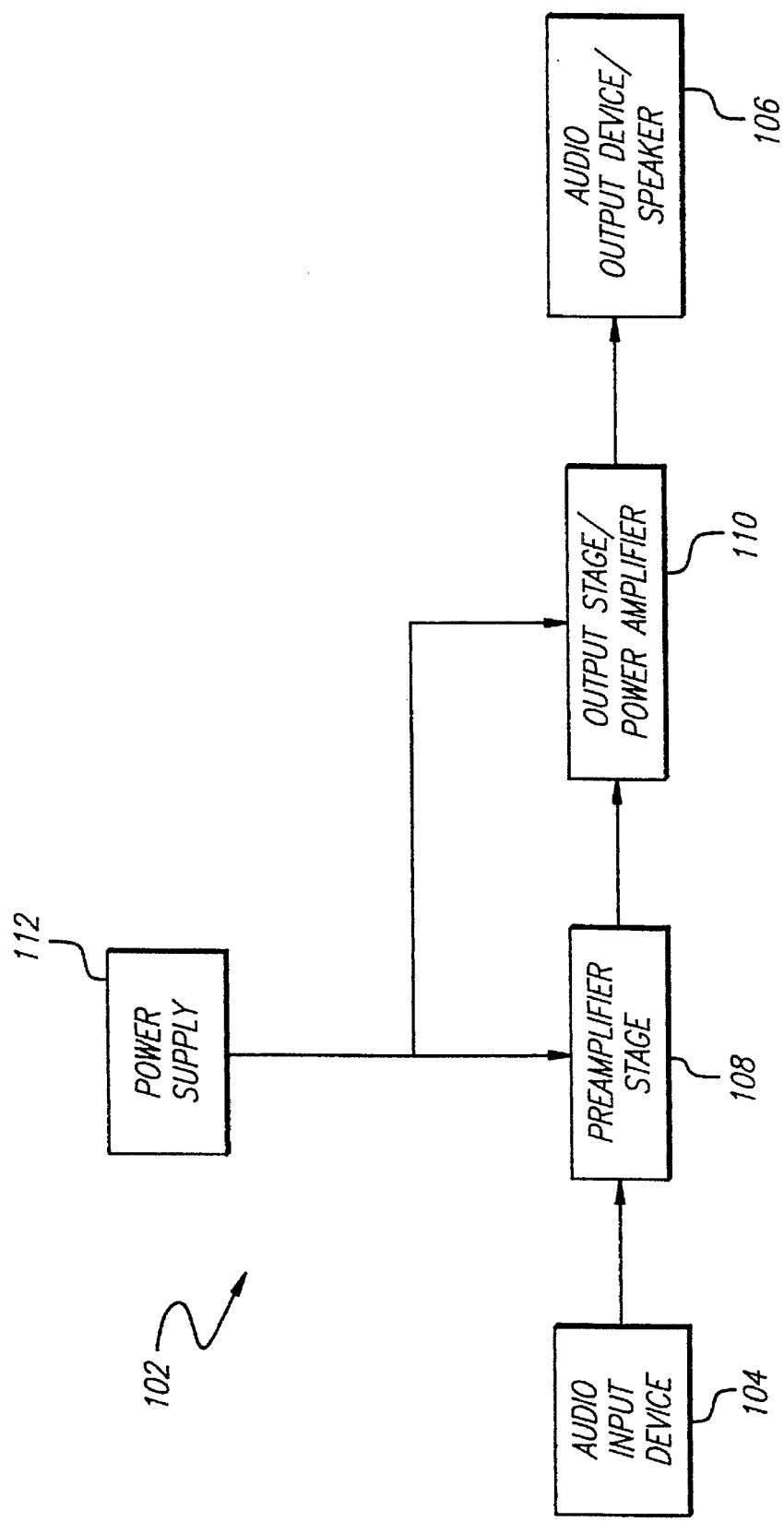
FIG. 4 is a block diagram of an audio signal reproduction system utilizing the output stage of the present invention.

FIG. 4 is a block diagram of an audio signal reproduction system 102 which includes an audio input device 104 and an audio output device 106 such as a conventional speaker. The system 102 also includes a preamplifier stage 108, an output stage/power amplifier 110 and a power supply 112. Audio signals from the audio input device 104 are received and amplified by the preamplifier stage 108 and the output stage 110 for reproduction by the audio output device 106. The output stage/power amplifier 110 may comprise the high-power, high-fidelity amplifier of the present invention.

Figure 2:
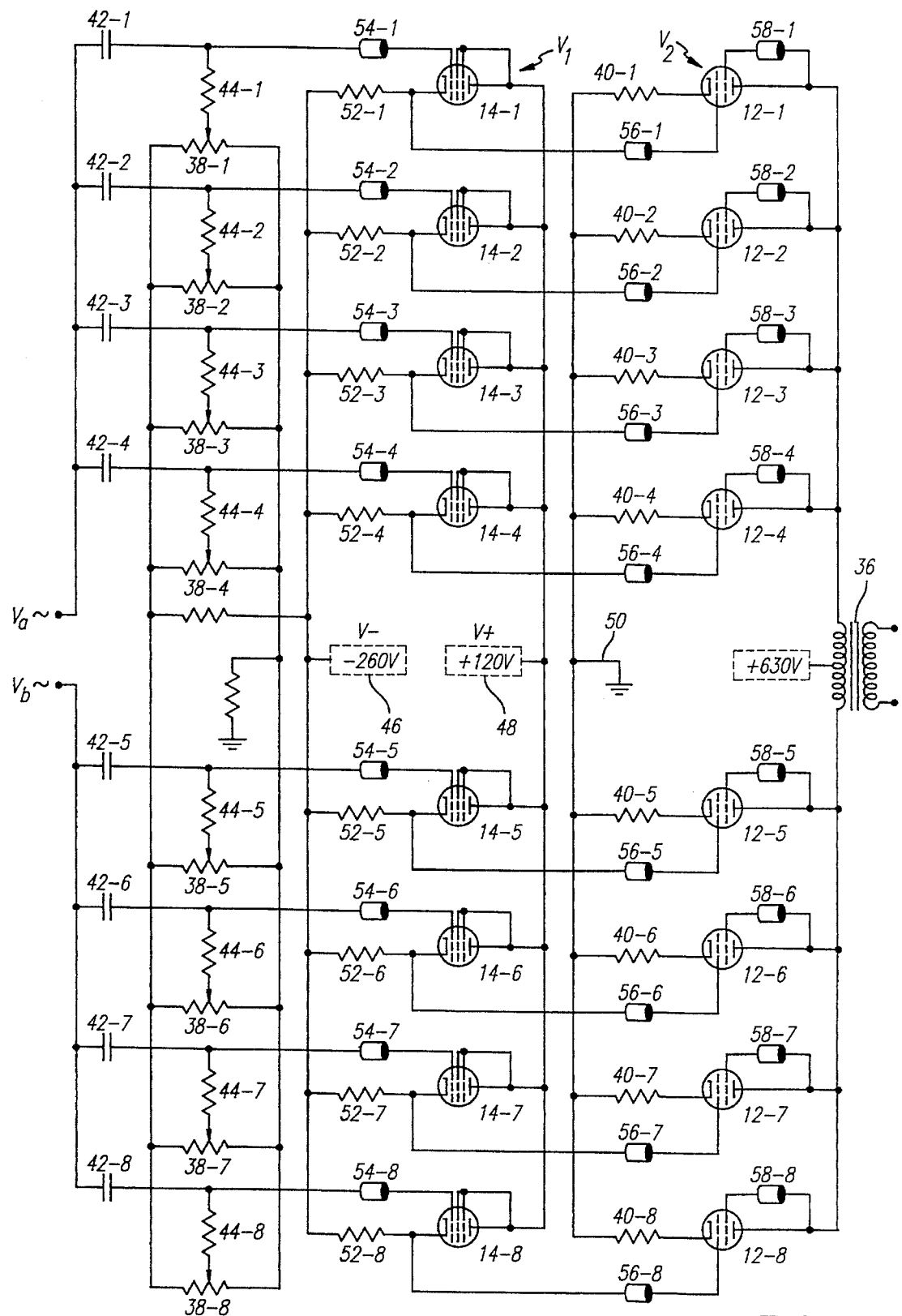
FIG. 2 is an electrical schematic of a push-pull audio amplifier output stage employing the high-power, high-fidelity tube amplifier configuration of the present invention.

FIG. 2 is an electrical schematic of a push-pull audio amplifier output stage 10 employing the high-power, high-fidelity tube amplifier configuration of the present invention. Generally, the output stage 10 includes a plurality of output tubes 12 connected in parallel to provide an output signal. Output tubes 12-1, 12-2, 12-3, 12-4 and output tubes 12-5, 12-6, 12-7, 12-8 amplify the input signals Va and Vb respectively.

Although eight output tubes 12 are shown in FIG. 2, the present invention, as will become apparent from the following discussion, contemplates a virtually indefinite parallel connection of output tubes.

A principal feature of the present invention is that each output tube has an individual current sink. The current sink for each output tube 12 is provided by a driver tube 14. More specifically, output tubes 12-1, 12-2, 12-3, 12-4, 12-5, 12-6, 12-7, 12-8 are driven by driver tubes 14-1, 14-2, 14-3, 14-4, 14-5, 14-6, 14-7, 14-8, respectively. The present invention provides at least as many current sinks as the number of output tubes 12. Preferably, the number of driver tubes 14 equals the number of output tubes 12.

High-power audio amplifiers, such as those utilized in conventional public address (PA) systems, generally provide distorted output signals. The present invention overcomes the problem of the unacceptably high total input capacitance of parallel output devices by providing each output tube 12 with an individual current sink (driver tube 14).

Figure 3:
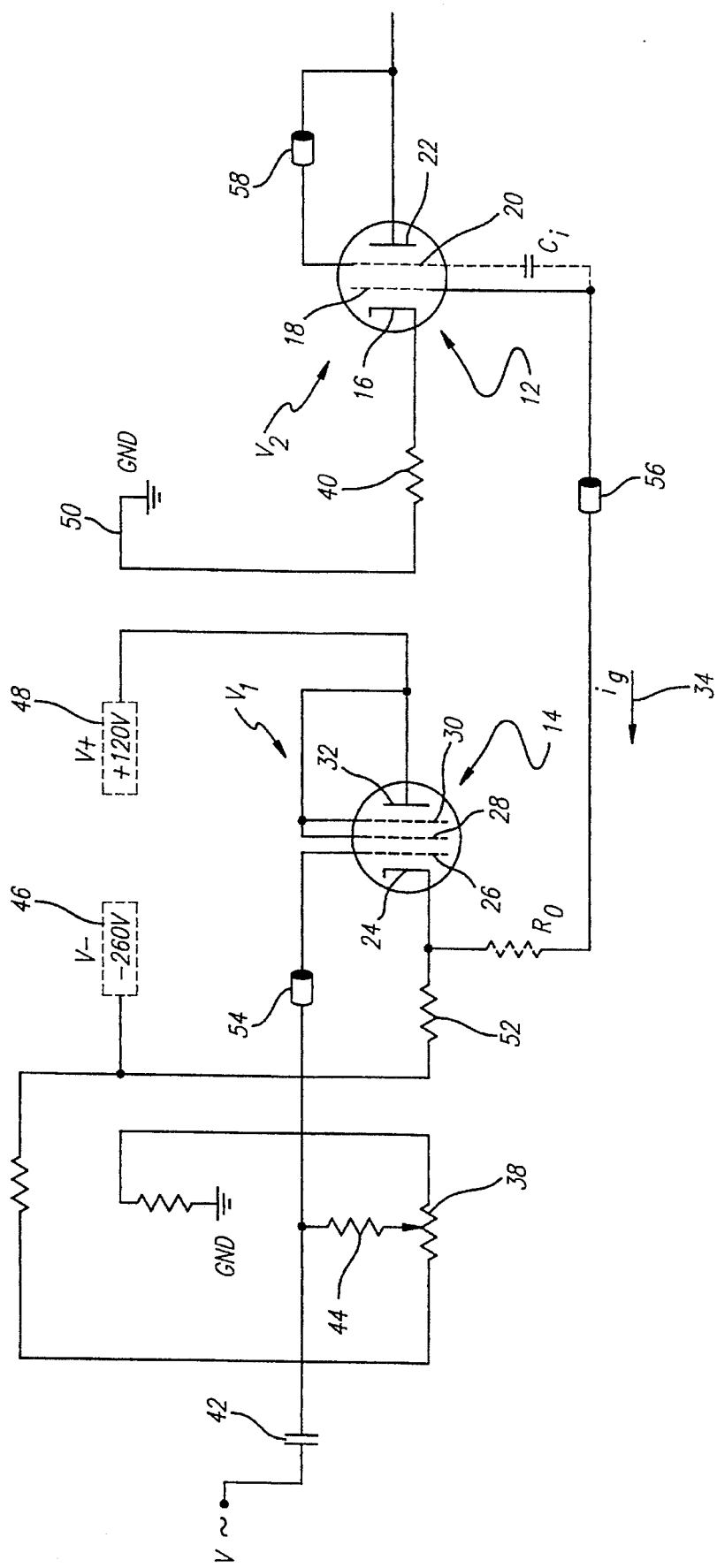
FIG. 3 is an enlarged view of a single output tube with its individual current sink according to the present invention.

FIG. 3 is an enlarged view of a single driver tube 14 with its corresponding output tube 12. The preferred output tube 12 is a kinkless tetrode (beam power pentode) which includes a cathode 16, a control grid 18, a screen grid 20, and a plate 22. The preferred output tube 12 may, but does not necessarily, comprise a KT-90 kinkless tetrode manufactured by Electronska (E.I.) of Yugoslavia. The preferred driver tube 14 is a triode-converted pentode which includes a cathode 24, a control grid 26, a screen grid 28, a suppression grid 30, and a plate 32. The preferred driver tube 14 may, but does not necessarily, comprise a 12GN7 triode-converted pentode which was manufactured by General Electric of Owensborough, Ky. The triode-converted operational configuration is obtained by electrically coupling the screen grid 28 and the suppression grid 30 to the plate 32.

A key feature of the high-power, high-fidelity amplifier is that each driver tube 14 is directly coupled to its corresponding output tube 12. More specifically, the cathode 24 of each driver tube 14 is electrically coupled to the control grid 18 of each output tube 12 such that the output impedance of the driver tube 14 decreases as the grid current of the corresponding output tube 12 increases.

When an output tube 12 is driven by the input signal past zero volts bias, the voltage at the control grid 18 transitions from a negative to a positive potential relative to the cathode 16. Electrons from the cathode 16 are then attracted by the positive potential on the control grid 18, and flow toward it in increasing numbers as the voltage on the control grid 18 is made more positive by the upward swing of the input signal.

The perveance of a tube is expressed as a constant of proportionality K, which depends on the electrode configuration. Generally speaking, the perveance of a tube defines its efficiency. A high perveance tube is able to attract electrons even at very low plate voltages. This allows the tube to give a greater output swing; which in turn increases power output.

Figure 1:
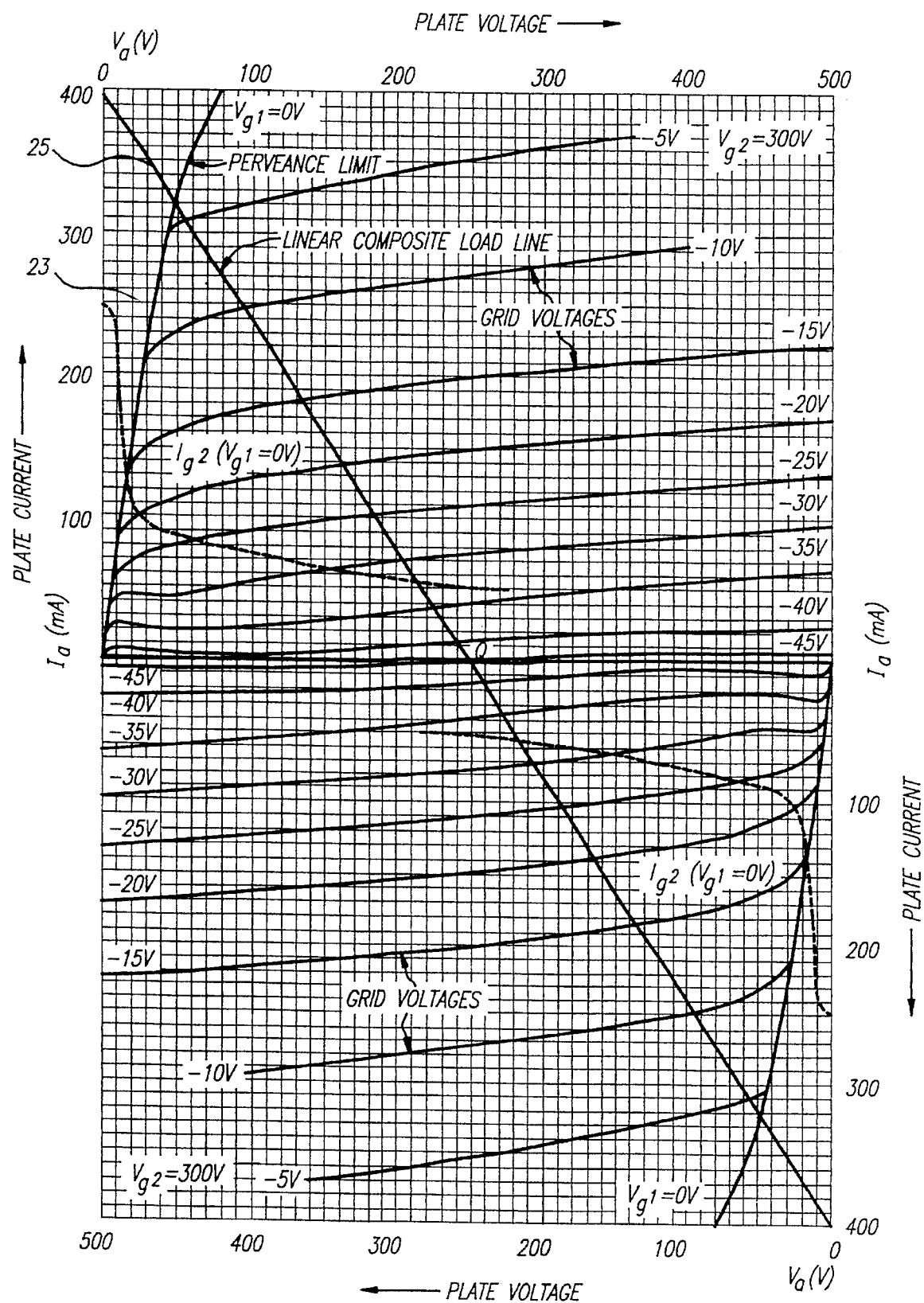
FIG. 1 is a plot of performance characteristics for a push-pull pair of KT88 beam tetrodes.

The perveance limit of an output tube 12 is conceptually illustrated in FIG. 1. As the voltage at the control grid 18 swings upward toward zero volts, operation of the tube moves up a composite load line 25 with the plate voltage decreasing. Once the load line 25 reaches the perveance limit 23, electrons will no longer be attracted from the cathode 16 to the plate 22. However, the perveance limit 23 can be shifted to the left by forcing the input grid to swing positive and this effectively increases the output swing producing greater power output. When the input voltage swing increases to the point where it equals the value of the plate voltage, the load line is said to have reached the diode line. At this point the tube operation becomes extremely non-linear; and so this represents the limit for high fidelity operation.

The amplifier of the present invention utilizes a "surrogate plate" so that each output tube 12 continues to provide a linear output even after the voltage at its control grid 18 swings positive. More specifically, the positively charged control grid 18 acts as a surrogate plate insofar as the control grid 18 continues to attract electrons from the cathode 16 even after the voltage at the plate 22 has swung to its perveance limit and is no longer able to attract electrons by its own field intensity.

The positive grid thus acts to increase the perveance of the tube by supplying current to the plate in spite of an insufficient potential at the plate. The incremental plate current, $\Delta i_b$, is thus increased by the superadded grid current; therefore the maximum power output is also increased, since power output is proportional to $$\Delta i_b \times \Delta e_b$$

where $\Delta e_b$ is the incremental plate voltage.

Some electrons will be intercepted by the grid, however, due to incidental collisions with the wire mesh. These intercepted electronics will then travel to the V1 cathode. This occurs because the V1 cathode is direct coupled to the V2 grid. Thus, electrons intercepted by the V2 grid appear simultaneously at the V1 cathode. From here they are attracted by the positive potential at the V1 plate and are swept out of the V2 grid. Hence the term "grid-current sink."

V1 is thus both a driver as well as a grid-current sink when V2 grid current flows. As the potential at the V2 grid is made more positive by the incoming audio signal, the V2 grid will continue to increase its attractive power over the passing electron stream. This means that more interceptions will occur for an increasing grid potential. This is why V1 requires a high plate dissipation and must be biased for low idle current. These two factors together provide the headroom needed by V1 to perform as a dynamic current sink.

There is, however, no increase in cathode current in V1. This is because cathode current only flows for changes in plate voltage or grid voltage; since, in triodes $$i_k = f(\mu e_c + e_b)$$

where $i_k$ is the instantaneous cathode current; $e_c$ is the instantaneous grid voltage; and $e_b$ is the instantaneous plate voltage.

Plate current only is increased in V1 because V2 grid current is external to V1 and neither $e_c$ nor $e_b$ changes in V1 when V2 grid current flows (provided that the V1 plate supply is of a low impedance type). The externally supplied V2 grid current is thus added to the internally generated V1 plate current such that the total incremental output current, $\Delta i_b$, is increased for a given change of input voltage, $\Delta e_c$. This is equivalent to an increase in transconductance, $g_m$, since $$g_m = \frac{\Delta i_b}{\Delta e_c} \mid e_b = k$$

This automatically enhances the ability of V1 to drive the output tube; since increased transconductance means lower output impedance, $R_o$. This follows because, for cathode followers $$\frac{1}{g_m} \cong R_o$$

This feature dramatically reduces driver distortion at higher levels of V2 grid current. It follows that the more headroom there is in V1 to sink grid current the lower will be the driver distortion.

However, to some extent the increase in distortion due to grid current is a function of the dramatic transition in load impedance when the input signal traverses the zero-crossing. The load on the driver then changes abruptly from a very high impedance (when the grid is <zero volts), to a very low impedance (when the grid is >zero volts).

As the V2 grid is made yet more positive by the input signal, electrons due to grid current will increase their flow to the V1 plate. If the input swing is continued further, the plate potential at V2 will drop below the level of its own input voltage (the diode line). At this point, grid current increases sharply, and driver distortion becomes unacceptable due to violent load transitions. As long as this point of conversion is respected, additional power can be obtained from V2 simply by sinking its grid current. High-fidelity power output of large magnitude thus becomes a problem of designing a driver which can dissipate the V2 grid current without overheating or otherwise loading down.

The driver tubes 14 may be any high transconductance tube of relatively high power dissipation. However, the higher the transconductance, the greater the susceptibility to parasitic oscillations. It is accordingly more and more critical to use suppression components; with due respect given to their type, number, and location within the circuit. The transconductance $g_m$ of the preferred driver tubes is between 2,500 μmhos (at idle) and 25,000 μmhos or greater (at maximum signal). Pentodes are a preferred choice of driver device because both transconductance and plate dissipation are of a high order in this class of tubes.

The pentodes are then converted to triodes to improve their sound quality. The pentode-converted triodes are then configured as cathode-followers. This not only reduces output impedance, but input capacitance as well. In the triode mode, the high amplification factor μ of the pentode (which is not needed in this case) is sacrificed, but the high transconductance $g_m$ is preserved because plate resistance $r_p$ is reduced along with mu. This further reduces output impedance $R_o$. This follows because, for cathode followers $$R_o \cong \frac{r_p}{\mu+1} \cong \frac{1}{g_m}$$

The high-pass filter effect of the input capacitance of the output tubes 12 can be reduced if the driver 14 presents a low enough series resistance. In the circuit of FIG. 2, the output impedance of each driver tube 14 is approximately 500Ω at idle, dropping to less than 30Ω at maximum signal. The low output impedance $R_o$ of the driver tubes 14 minimizes the low-pass filter effect created by $R_o$ in series with $C_i$ of the output tubes 12 (See FIG. 3). Since the output impedance of the driver is reduced for larger signal swings, and since the input capacitance affects high frequencies only, this constitutes an effective increase in slew rate (because the peak voltage $V_p$ will be increased at these frequencies). This follows from the familiar slew rate equation $$2\pi f_{max} V_p.$$

Moreover, since each current sink only drives one output tube 12, the total capacitance seen by any one current sink is reduced to approximately 100–200 pF (for the circuit of FIG. 2). Thus, the current sinks are able to drive the parallel output tubes 12 to a very high frequency (greater than 1 Mhz provided the output capacitance of the output tubes 12 is neutralized). Ergo, the high-power, high-fidelity tube amplifier is characterized by superior frequency response (i.e., little or no attenuation of the reproduced signal) between 16 Hz and 100 kHz when a sufficiently responsive output transformer is employed. This enables a phase coherent and therefore a more uniform feedback response at high frequencies, ensuring reduced high frequency distortion.

Direct or capacitive coupling may be alternatively utilized in the output stage in lieu of a wide-bandwidth output transformer 36 as shown in FIG. 2.

The high-power, high-fidelity tube amplifier of the present invention advantageously uses individual current sinks to preserve a wide amplifier bandwidth. Since the loading on each current sink remains the same regardless of the number of output tubes employed, the increase in the total input capacitance of the output tubes 12 is evenly distributed among the current sinks. Accordingly, power may be increased indefinitely by employing the amplifier configuration of the present invention without compromising bandwidth or increasing high frequency distortion.

Class $AB_2$ operation of the circuit in FIG. 2 forces the output tubes into grid current, which causes the tubes to move further up the load line thereby enabling more power to be developed. The subscript "2" signifies that the driver tube is driven into grid current.

In utilizing the preferred 12GN7 triode-converted pentode as the individual current sinks, an eight watt (W) increase in usable power output per output tube 12 has been observed. The total power output of the circuit is thus 300W, rather than 236W as it would be without the current sinks.

The current sinks are cathode self-biased and are biased for low idle current in order to provide the headroom needed when grid current flows. In the circuit of FIG. 2, the driver tubes 14 are biased to operate at an idle current of approximately 5 ma per tube. As stated supra, under small-signal conditions, the output impedance of the current sinks is approximately 500Ω.

Under large-signal conditions, the current sinks, being directly coupled to the output tubes 12, are compelled to increase their plate current (to approximately 40 ma per tube), in order to sink the grid current 34 which flows out of the output tubes 12. The path along which current is sunk continues from the plate 32 of each current sink to the secondary of the V1 plate transformer (not shown). The current then returns to the cathodes of the output tubes via the common rail.

The output tubes 12 operate by fixed-bias. The bias of each output tube 12 is individually adjusted via a potentiometer 38 associated with each driver tube 14. Preferably, the potentiometer 38 comprises a 100KΩ, 1W potentiometer electrically connected as shown in FIG. 2. The bias-voltage adjustment of the circuit ranges between −40 V and −90 V, and therefore accommodates a wide variety of tube types. For example, the preferred KT90 output tube 12 may be replaced with tube types 6550 or KT88. A cathode current sense resistor 40 (FIGS. 2 and 3) in the cathode circuit of each output tube causes a small voltage to appear at the cathode 16 so that the cathode current may be sensed by a panel-type milliammeter (1 ma FS) to facilitate biasing. The preferred cathode current resistor 40 is a 2Ω, 5W resistor.

The preferred bias adjustment circuitry includes a DC blocking capacitor 42 and a fixed bias resistor 44, in addition to the potentiometer 38. Identical bias adjustment circuitry is provided for each driver tube 14. As shown in FIG. 2, the potentiometers 38-1, 38-2, 38-3, 38-4, 38-5, 38-6, 38-7, 38-8 are associated with driver tubes 14-1, 14-2, 14-3, 14-4, 14-5, 14-6, 14-7, 14-8, respectively. The DC blocking capacitors 42-1, 42-2, 42-3, 42-4, 42-5, 42-6, 42-7, 42-8 are electrically coupled between the input signal terminal and the control grid 26 of the driver tubes 14-1, 14-2, 14-3, 14-4, 14-5, 14-6, 14-7, 14-8, respectively. The preferred bias capacitor 42 is a 0.047 μF, 600 V capacitor. The fixed bias resistors 44-1, 44-2, 44-3, 44-4, 44-5, 44-6, 44-7, 44-8 are electrically connected between the bias capacitors 42 and the potentiometers 38 associated with the driver tubes 14-1, 14-2, 14-3, 14-4, 14-5, 14-6, 14-7, 14-8, respectively. The preferred fixed bias resistor 44 is a 1MΩ, 1W resistor.

The large adjustment range of the bias circuit has only a small effect on the current sinks. In the driver tubes 14, the current flow changes by only 1.25 ma per tube across the full range of adjustment with the nominal idle current for each current sink being 5 ma. However, the current through the output tubes 12 changes from approximately 20 ma to over 100 ma across the range of adjustment with the nominal idle current for each output tube 12 being 65 ma.

The preferred KT90 output tube 12 is characterized by a high plate dissipation, and is able to withstand high operating voltages (up to 650 V) on its screen grid 20. Although the maximum plate voltage of the KT90 tube is rated at 850 V, the plate 22 is constrained to a maximum of 650 V in the triode mode. Generally, the power output of tube amplifiers increases in direct proportion to applied plate voltage, so long as the allowable plate dissipation is not exceeded and provided the maximum plate voltage is not exceeded.

Further with regard to the output tubes 12, tubes which allow a small amount of grid heating should be selected. In the circuit shown in FIG. 2, the grid heating in the output tube 12 is equivalent to approximately ⅛W of power dissipation. Such heating is at least five times less that what the KT90 tube can withstand (as determined by dismantling a sampling of KT90 tubes and testing the electrodes for power dissipation). Furthermore, the grid heating does not even begin until after the circuit in FIG. 2 has surpassed 236W of output power. Even then, the heating is not continuous, but occurs on every other half-cycle (i.e., on positive input swings only). The amplifier of FIG. 2 operates in class-A up to 70W output, in class-AB up to 236W output, and in class $AB_2$ up to 300W output.

Power supplies 46, 48 and ground 50 are electrically connected to the output stage 10 as shown in FIG. 2. The power supply 46 (V−) is connected to the cathode circuit of each driver tube 14 via cathode resistors 52-1, 52-2, 52-3, 52-4, 52-5, 52-6, 52-7, 52-8 and preferably provides −260 V. The power supply 48 (V+) is connected to the plate 32 of the driver tubes 14-1, 14-2, 14-3, 14-4, 14-5, 14-6, 14-7, 14-8, respectively, and preferably provides +120 V. The ground 50 is electrically connected to the cathode current-sense resistors 40-1, 40-2, 40-3, 40-4, 40-5, 40-6, 40-7, 40-8 and to the bias adjustment circuitry associated with the driver tubes 14-1, 14-2, 14-3, 14-4, 14-5, 14-6, 14-7, 14-8.

The current sinks are also beneficial because they promote fast recovery after clipping. Since each current sink is direct coupled, the circuit of FIG. 2 does not bias back the output tubes 12 at clipping as does a circuit which capacitively couples the signal into the control grids of the output tubes. With a capacitor coupled into the input of the output tube(s), excess negative charge will be added to the grid side of the capacitor whenever grid current flows. The excess charge will overbias the tube until such charge can be bled out of the capacitor. During this time the waveform will be distorted. The time to bleed off the excess charge will be determined by the RC time constant of the coupling circuit. With no energy stored in a coupling capacitor (because of direct coupling) the circuit in FIG. 2 is able to recover its equilibrium after clipping with no significant delay or instability.

The recovery time is thus governed only by the time constants associated with the power supplies 46, 48 (provided feedback has been correctly applied). So long as the power supplies 46, 48 are characterized by a low impedance (i.e, they should be choke-dominated or voltage-regulated), recovery will be virtually instantaneous after clipping. A fast recovery characteristic, while not increasing power output per se, creates a subjective effect of greater ease and authority.

An additional problem associated with parallel output tubes is tube interaction caused by mismatched tubes, where one tube may clip before another. The individual current sinks provide improved isolation and prevent interaction caused by mismatched tubes. Overall distortion is reduced in the amplifier of the present invention because should one output tube 12 clip first, it will not interfere with the driving ability of the other current sinks.

The high-power, high-fidelity amplifier also includes a plurality of parasitic suppression components electrically coupled to the output tubes 12 and the driver tubes 14. The parasitic suppression components associated with each output tube 12 and its individual current sink are preferably of uniform quality, quantity and position (i.e., points of insertion). In the preferred embodiment shown in FIG. 2, the parasitic suppression components include a first group 54-1, 54-2, 54-3, 54-4, 54-5, 54-6, 54-7, 54-8 which are electrically coupled to the grids 26 of the driver tubes 14-1, 14-2, 14-3, 14-4, 14-5, 14-6, 14-7, 14-8, respectively. More specifically, the first group 54 are each connected in series between the grids 26 and the bias adjustment circuitry associated with each of the driver tubes 14.

Further in the preferred embodiment of FIG. 2, the parasitic suppression components include a second group 56-1, 56-2, 56-3, 56-4, 56-5, 56-6, 56-7, 56-8 and a third group 58-1, 58-2, 58-3, 58-4, 58-5, 58-6, 58-7, 58-8 of parasitic suppression components. The second group 56 are each electrically coupled between the cathode 24 of each driver tube 14 and the control grid 18 of the corresponding output tube 12. The third group 58 of parasitic suppression components are electrically coupled to the screen grids 20 of each output tube 12. More specifically, the third group 58-1, 58-2, 58-3, 58-4, 58-5, 58-6, 58-7, 58-8 of parasitic suppression components are connected in series between the screen grid 20 and the +630 V power supply.

The parasitic suppression components prevent inductive coupling at high frequencies and suppress other types of high frequency disturbances which would otherwise cause the amplifier to go unstable. Generally, parasitic oscillations cause amplifier instability by distorting and modulating waveforms and by introducing high frequency phase shift. The amplifier of the present invention is particularly susceptible to such high frequency oscillations because of the high transconductance drivers used therein.

The preferred parasitic suppression components comprise standard 2½ turn ferrite beads which may be purchased from Ferronics of Fairport, New York. Ferrite beads are preferred over other materials because ferrite beads provide superior suppressive capabilities and are susceptible to heating only by very high frequency signals. Although resistors are an alternative material, they are less preferred because they exhibit inferior suppressive capabilities and are susceptible to cracking during tube failures, and by surge currents of any frequency, thus necessitating their replacement. Also, in the implementation of the circuit of FIG. 2, it was found that resistors alone could not prevent driver instability.

Another advantage provided by the amplifier of the present invention is the elimination of the need to employ an audio interstage transformer as is normally dictated by class-$AB_2$ operation. The individual current sinks eliminate the need for an audio interstage transformer; along with the bandwidth and distortion limitations associated therewith.

An additional advantage provided by the amplifier of FIG. 2 is that a stronger feedback signal may be provided by virtue of the amplifier's increased bandwidth. Although FIG. 2 does not show the use of feedback, such use is consistent with, and contemplated to be within, the technique disclosed herein.

A further advantage of the high-power, high-fidelity amplifier is that it does not depend upon bypass capacitors in the bias circuits which otherwise contribute a low-frequency pole. The McIntosh MC3500 used a single current sink per push-pull side in an audio amplifier with eight output tubes in push-pull parallel. The audio signal was then divided into four parallel channels per push-pull side. The problem was then to ensure that the eight push-pull channels were of equal amplitude up to the clipping point. Accordingly, a signal bypass capacitor (50 μF, 150 V) was employed in the McIntosh MC3500 so that the signal level going to each output tube would not vary with adjustments to the bias controls. In contrast, the individual current sinks of the present invention increase the low-frequency stability margin of the high-power, high-fidelity amplifier by eliminating the need for a bypass capacitor. Alternatively, more feedback may be applied to the amplifier at low frequencies.

In conclusion, it is to be understood that the foregoing detailed description and the accompanying drawings illustrate the principles of the invention. However, various changes and modifications may be employed without departing from the spirit and scope of the invention. Thus, by way of example and not of limitation, output devices other than triodes may also be configured in parallel and thereby benefit from the current sinking technique disclosed herein. For example, the performance of solid-state transistors may be improved, albeit at higher power levels.

It is additionally contemplated that multiple current sinks in parallel may be employed for each output device. By this means, more output power and/or lower distortion could be obtained; especially in transmitting tubes which draw more grid current than receiving tubes. Other mechanical and electrical changes of a comparable nature could also be made. Accordingly, the present invention is not limited to the specific form shown in the drawings and described in detail hereinabove.

For example, a specialized application contemplated for this invention relates to the guitar industry. In this industry, sound quality of a specific nature is paramount. Among electric guitar players, tube type amplifiers are considered to be special, due to their desirable distortion characteristics. Each guitar player strives to achieve a unique, trademark sound which will identify himself to his fans. This is done by combining a particular guitar with a particular amplifier or by adding special effects devices such as phasers or flangers.

One of the requirements of guitar amplifiers is that they must be overdriven, in order to produce the desired distortion. Normally, a preamp stage will be the overdriven element in the amplifier. However, under demanding concert conditions, the output stage may clip inadvertently, ruining the effect. The invention described herein is particularly suitable for this application since it may be overdriven hard and yet will recover instantly. Conventional amplifiers suffer from bias blocking of the output tubes when clipped. Recovery is thus delayed by the time constant of the RC network which couples into the output stage.

An additional advantage of this invention is its relative size. Guitar amplifiers are frequently chosen based on their compact size, or power-to-weight ratio. This is because the player must frequently carry and transport his equipment. The invention is thus advantageous due to its high power-to-weight ratio.

What is claimed is:

1. A high-power, high-fidelity tube amplifier comprising:
   a plurality of output tubes including a cathode, a control grid, a screen grid and a plate, said screen grid and said plate of each output tube being electrically coupled together, and said output tubes being connected in parallel to provide an output signal;
   a plurality of high transconductance driver tubes including a cathode, a control grid, a screen grid, a suppressor grid and a plate, said screen grid, said suppressor grid and said plate of each driver tube being electrically coupled together, and said cathode of each driver tube being electrically coupled to said control grid of a corresponding output tube such that an output impedance of said driver tube decreases as a grid current of said corresponding output tube increases; and
   a plurality of parasitic suppression components including a first group, a second group and a third group, said first group being electrically coupled to said control grids of said driver tubes, said second group being electrically coupled between said cathode of each driver tube and said control grid of said corresponding output tube, and said third group being electrically coupled to said screen grids of said output tubes.

2. The high-power, high-fidelity tube amplifier of claim 1 wherein said output tubes are arranged in a push-pull configuration.

3. The high-power, high fidelity tube amplifier of claim 1 wherein said output tubes are arranged in single-ended configuration.

4. The high-power, high-fidelity tube amplifier of claim 1 wherein said output tubes are configured to operate in a fixed bias mode.

5. The high-power, high-fidelity tube amplifier of claim 4 further comprising bias circuitry for configuring said output tubes to operate in said fixed-bias mode.

6. The high-power, high-fidelity tube amplifier of claim 5 wherein said bias circuitry comprises one resistor, one capacitor and one potentiometer for each of said output tubes.

7. The high-power, high-fidelity tube amplifier of claim 1 wherein said output tubes comprise a plurality of triode converted beam pentodes.

8. The high-power, high-fidelity tube amplifier of claim 7 wherein said triode converted beam pentodes comprise a plurality of KT90 kinkless tetrodes.

9. The high-power, high-fidelity tube amplifier of claim 1 wherein said driver tubes are configured to operate in a self-biased mode.

10. The high-power, high-fidelity tube amplifier of claim 1 wherein said driver tubes are biased to operate at a driver tube idle current of approximately 5 ma per driver tube in order to provide headroom for the "active" feature described in the disclosure.

11. The high-power, high-fidelity tube amplifier of claim 1 wherein said output impedance of each driver tube is approximately 500 Ω under a small signal condition.

12. The high-power, high-fidelity tube amplifier of claim 1 wherein said output impedance of each driver tube is approximately 30 Ω when said grid current is at a maximum grid current value.

13. The high-power, high-fidelity tube amplifier of claim 1 wherein said driver tubes comprise a plurality of triode converted pentodes.

14. The high-power, high-fidelity tube amplifier of claim 13 wherein said triode converted pentodes comprise a plurality of 12GN7 triode converted pentodes.

15. The high-power, high-fidelity tube amplifier of claim 13 wherein said parasitic suppression components comprise a plurality of ferrite beads.

16. The high-power, high-fidelity tube amplifier of claim 13 wherein said ferrite beads are threaded by 2½ loops of wire per bead.

17. A high-power, high-fidelity tube amplifier comprising:
   a plurality of output tubes including a cathode, a control grid, a screen grid and a plate, said screen grid and said plate of each output tube being electrically coupled, and said output tubes being connected in parallel to provide an output signal;
   a plurality of high transconductance driver tubes electrically connected to said output tubes as individual current sinks, said driver tubes including a cathode, a control grid and a plate, said cathode of each driver tube being electrically coupled to said control grid of a single, corresponding output tube such that an output impedance of said driver tube decreases as a grid current of said corresponding output tube increases; and a plurality of parasitic suppression components electrically coupled to said output tubes and said driver tubes.

18. The high-power, high-fidelity tube amplifier of claim 17 wherein said output tubes are arranged in a push-pull configuration.

19. The high-power, high-fidelity tube amplifier of claim 17 wherein said output tubes are configured to operate in a fixed bias mode.

20. The high-power, high-fidelity tube amplifier of claim 19 further comprising bias circuitry for configuring said output tubes to operate in said fixed-bias mode.

21. A high-power, high-fidelity tube amplifier comprising:

a plurality of output tubes including a cathode, a control grid, a screen grid and a plate, said screen grid and said plate of each output tube being electrically coupled, and said output tubes being connected in parallel to provide an output signal, said output tubes being configured to operate in a fixed-bias mode;

a plurality of high transconductance driver tubes including a cathode, a control grid and a plate, said cathode of each driver tube being electrically coupled to said control grid of a corresponding output tube such that a output impedance of said driver tube decreases as a grid current of said corresponding output tube increases;

a plurality of parasitic suppression components electrically coupled to said output tubes and said driver tubes; and bias circuitry for configuring said output tubes to operate in said fixed-bias mode, said bias circuitry comprising one resistor, one capacitor and one potentiometer for each of said output tubes.

22. The high-power, high-fidelity tube amplifier of claim 17 wherein said output tubes comprise a plurality of triode converted beam pentodes.

23. The high-power, high-fidelity tube amplifier of claim 22 wherein said triode converted beam pentodes comprise a plurality of KT90 kinkless tetrodes.

24. The high-power, high-fidelity tube amplifier of claim 17 wherein said driver tubes are configured to operate in a self-biased mode.

25. The high-power, high-fidelity tube amplifier of claim 17 wherein said driver tubes are biased to operate at a driver tube idle current of approximately 5 ma per driver tube.

26. The high-power, high-fidelity tube amplifier of claim 17 wherein said output impedance of each driver tube is approximately 500 Ω under a small signal condition.

27. The high-power, high-fidelity tube amplifier of claim 17 wherein said output impedance of each driver tube is approximately 30 Ω when said grid current is at a maximum grid current value.

28. A high-power, high-fidelity tube amplifier comprising:

a plurality of output tubes including a cathode, a control grid, a screen grid and a plate, said screen grid an said plate of each output tube being electrically coupled, and said output tubes being connected in parallel to provide an output signal;

a plurality of high transconductance river tubes including a cathode, a control grid and a plate, said cathode of each driver tube being electrically coupled to said control grid of a corresponding output tube such that an output impedance of said driver tube decreases as a grid current of said corresponding output tube increases, said driver tubes further including a screen grid and a suppressor grid, and wherein said screen grid, said suppressor grid and said plate of each driver tube are electrically coupled together; and a plurality of parasitic suppression components electrically coupled to said output tubes and said driver tubes.

29. The high-power, high-fidelity tube amplifier of claim 17 wherein said driver tubes comprise a plurality of triode converted pentodes.

30. The high-power, high-fidelity tube amplifier of claim 29 wherein said triode converted pentode comprise a plurality of 12GN7 triode converted pentodes.

31. A high-power, high-fidelity tube amplifier comprising:

a plurality of output tubes including a cathode, a control grid, a screen grid and a plate, said screen grid and said plate of each output tube being electrically coupled, an said output tubes being connected in parallel to provide an output signal;

a plurality of high transconductance driver tubes including a cathode, a control grid and a plate, said cathode of each driver tube being electrically coupled to said control grid of a corresponding output tube such that an output impedance of said driver tube decreases as a grid current of said corresponding output tube increases, said driver tubes comprising a plurality of triode converted pentodes; an a plurality of parasitic suppression components electrically coupled to said output tubes and said driver tubes, said parasitic suppression components comprising a plurality of ferrite beads.

32. The high-power, high-fidelity tube amplifier of claim 31 wherein said ferrite beads are threaded by 2½ loops of wire per bead.

33. A high-power, high-fidelity tube amplifier comprising:

a plurality of output tubes connected in parallel to provide an output signal;

a plurality of high transconductance drivers electrically connected to said output tubes as individual current sinks, each driver being electrically coupled to a single, corresponding output tube such that an output impedance of said driver decreases as a grid current of said corresponding output tube increases; and a plurality of parasitic suppression components electrically coupled to said output tubes and said drivers.

34. The high-power, high-fidelity tube amplifier of claim 33 wherein said output tubes are arranged in a push-pull configuration.

35. The high-power, high-fidelity tube amplifier of claim 33 wherein said output tubes are arranged in a single-ended configuration.

36. The high-power, high-fidelity tube amplifier of claim 33 wherein said output tubes are configured to operate in a fixed bias mode.

37. The high-power, high-fidelity tube amplifier of claim 36 further comprising bias circuitry for configuring said output tubes to operate in said fixed-bias mode.

38. A high-power, high-fidelity tube amplifier comprising:

a plurality of output tubes connected in parallel to provide an output signal, said output tubes being configured to operate in a fixed-bias mode;

a plurality of high transconductance drivers, each driver being electrically coupled to a corresponding output tube such that an output impedance of said driver decreases as a grid current of said corresponding output tube increases;

a plurality of parasitic suppression components electrically coupled to said output tubes and said drivers; and bias circuitry for configuring said output tubes to operate in said fixed-bias mode, said bias circuitry comprising one resistor, one capacitor and one potentiometer for each of said output tubes.

39. The high-power, high-fidelity tube amplifier of claim 33 wherein said output tubes comprise a plurality of triode converted beam pentodes.

40. The high-power, high-fidelity tube amplifier of claim 39 wherein said triode converted beam pentodes comprise a plurality of KT90 kinkless tetrodes.

41. The high-power, high-fidelity tube amplifier of claim 33 wherein said drivers are configured to operate in a self-biased mode.

42. The high-power, high-fidelity tube amplifier of claim 33 wherein said drivers are biased to operate at a driver tube idle current of approximately 5 ma per driver tube.

43. The high-power, high-fidelity tube amplifier of claim 33 wherein said output impedance of each driver is approximately 500 $\Omega$ under a small signal condition.

44. The high-power, high-fidelity tube amplifier of claim 33 wherein said output impedance of each driver is approximately 30 $\Omega$ when said grid current is at a maximum grid current value.

45. The high-power, high-fidelity tube amplifier of claim 33 wherein each of said drivers includes a cathode, each of said output tubes includes a control grid, and each cathode is electrically coupled to said control grid of said corresponding output tube.

46. The high-power, high-fidelity tube amplifier of claim 33 wherein said drivers comprise a plurality of triode converted pentodes.

47. The high-power, high-fidelity tube amplifier of claim 46 wherein said triode converted pentode comprise a plurality of 12GN7 triode converted pentodes.

48. A high-power, high-fidelity tube amplifier comprising:

a plurality of output tubes connected in parallel to provide an output signal;

a plurality of high transconductance drivers, each driver being electrically coupled to a corresponding output tube such that an output impedance of said driver decreases as a grid current of said corresponding output tube increases, said drivers comprising a plurality of triode converted pentodes; and a plurality of parasitic suppression components electrically coupled to said output tubes and said drivers, said parasitic suppression components comprising a plurality of ferrite beads.

49. The high-power, high-fidelity tube amplifier of claim 48 wherein said ferrite beads are threaded by 2½× loops of wire per bead.

50. A high-power, high-fidelity tube amplifier comprising:

at least two push-pull pairs of output tubes connected in parallel to provide an output signal; and a plurality of high transconductance drivers electrically connected to said output tubes as individual current sinks, each driver being electrically coupled to a single, corresponding output tube such that an output impedance of said driver decreases as a grid current of said corresponding output tube increases.

\* \* \* \* \*